(12) United States Patent
Wu et al.

(10) Patent No.: US 10,957,587 B2
(45) Date of Patent: Mar. 23, 2021

(54) STRUCTURE AND FORMATION METHOD OF SEMICONDUCTOR DEVICE WITH CONDUCTIVE FEATURE

(71) Applicant: Taiwan Semiconductor Manufacturing Company, Ltd., Hsinchu (TW)

(72) Inventors: Li-Chieh Wu, Hsinchu (TW); Kuo-Hsiu Wei, Tainan (TW); Kei-Wei Chen, Tainan (TW); Tang-Kuei Chang, Tainan (TW); Chia Hsuan Lee, Hsinchu (TW); Jian-Ci Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/450,665

(22) Filed: Jun. 24, 2019

(65) Prior Publication Data
US 2020/0043786 A1 Feb. 6, 2020

Related U.S. Application Data

(60) Provisional application No. 62/712,319, filed on Jul. 31, 2018.

(51) Int. Cl.
*H01L 23/48* (2006.01)
*H01L 21/768* (2006.01)
(Continued)

(52) U.S. Cl.
CPC .......... *H01L 21/76895* (2013.01); *C09G 1/04* (2013.01); *H01L 21/3212* (2013.01);
(Continued)

(58) Field of Classification Search
CPC ........... H01L 21/76895; H01L 21/3212; H01L 21/76805; H01L 21/76823; H01L 21/76843; H01L 21/76888; H01L 23/53266; H01L 23/535; H01L 21/7684; H01L 21/76879; H01L 21/76831; H01L 21/30625; H01L 23/48; C09G 1/04
See application file for complete search history.

(56) References Cited

U.S. PATENT DOCUMENTS

2002/0022335 A1* 2/2002 Chen .................. H01L 28/40
438/396
2004/0055993 A1* 3/2004 Moudgil ................ C09G 1/02
216/2
(Continued)

*Primary Examiner* — Robert G Bachner
(74) *Attorney, Agent, or Firm* — Slater Matsil, LLP (57) ABSTRACT

A structure and a formation method of a semiconductor device are provided. The method includes forming a conductive feature over a semiconductor substrate and forming a dielectric layer over the conductive feature. The method also includes forming an opening in the dielectric layer to expose the conductive feature. The method further includes forming a conductive material to overfill the opening. In addition, the method includes thinning the conductive material using a chemical mechanical polishing process. A slurry used in the chemical mechanical polishing process includes an iron-containing oxidizer that oxidizes a portion of the conductive material.

20 Claims, 5 Drawing Sheets

(51) Int. Cl.
*H01L 21/321* (2006.01)
*C09G 1/04* (2006.01)
*H01L 23/532* (2006.01)
*H01L 23/535* (2006.01)

(52) U.S. Cl.
CPC .... *H01L 21/7684* (2013.01); *H01L 21/76805* (2013.01); *H01L 21/76823* (2013.01); *H01L 21/76843* (2013.01); *H01L 21/76888* (2013.01); *H01L 23/535* (2013.01); *H01L 23/53266* (2013.01)

(56) References Cited

U.S. PATENT DOCUMENTS

| | | | | |
|---|---|---|---|---|
| 2004/0234895 | A1* | 11/2004 | Lee | H01L 27/2436 430/311 |
| 2015/0041748 | A1* | 2/2015 | Hayakawa | H01L 27/101 257/2 |
| 2015/0194318 | A1* | 7/2015 | Lee | H01L 21/32115 438/693 |

* cited by examiner

STRUCTURE AND FORMATION METHOD OF SEMICONDUCTOR DEVICE WITH CONDUCTIVE FEATURE

PRIORITY CLAIM AND CROSS-REFERENCE

This Application claims the benefit of U.S. Provisional Application No. 62/712,319, filed on Jul. 31, 2018, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 1A:
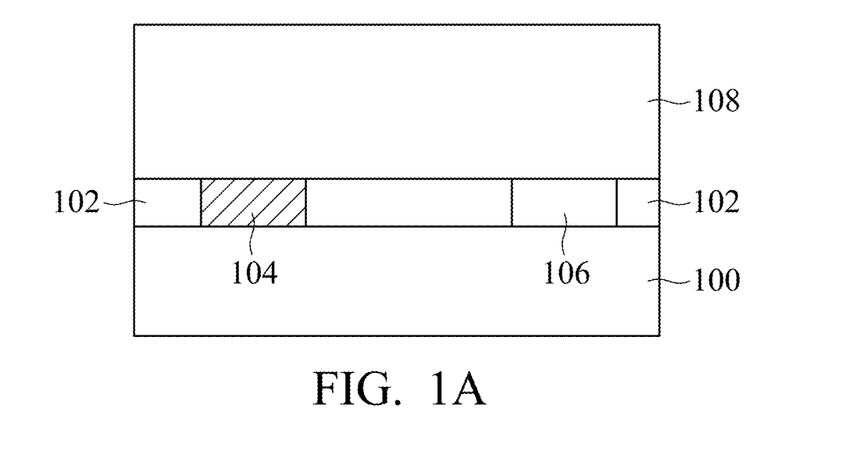
FIGS. 1A-1I are cross-sectional views of various stages of a process for forming a semiconductor device structure, in accordance with some embodiments.

FIGS. 1A-1I are cross-sectional views of various stages of a process for forming a semiconductor device structure, in accordance with some embodiments. As shown in FIG. 1A, a semiconductor substrate 100 is received or provided. In some embodiments, the semiconductor substrate 100 is a bulk semiconductor substrate, such as a semiconductor wafer. For example, the semiconductor substrate 100 includes silicon or other elementary semiconductor materials such as germanium. In some embodiments, the semiconductor substrate 100 includes an epitaxially grown semiconductor layer on a dielectric layer. The epitaxially grown semiconductor layer may be made of silicon germanium, silicon, germanium, one or more other suitable materials, or a combination thereof.

In some other embodiments, the semiconductor substrate 100 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

In some embodiments, various device elements are formed in and/or on the semiconductor substrate 100. Examples of the various device elements include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), diodes, light sensors, one or more other suitable elements, or a combination thereof.

As shown in FIG. 1A, a conductive feature 104 is formed over the semiconductor substrate 100, in accordance with some embodiments. In some embodiments, the conductive feature 104 is a conductive contact. In some embodiments, the conductive feature 104 is electrically connected to a source/drain structure of a transistor, a gate stack of a transistor, or another element formed below the conductive feature 104. In some embodiments, the conductive feature 104 is made of a metal material. The metal material may include cobalt, ruthenium, gold, platinum, tungsten, one or more other suitable materials, or a combination thereof.

As shown in FIG. 1A, an element 106 is formed over the semiconductor substrate 100, in accordance with some embodiments. In some embodiments, the element 106 and the conductive feature 104 are made of different materials. In some embodiments, the element 106 is made of a metal material that is different from the material of the conductive feature 104. In some other embodiments, the element 106 is made of a semiconductor material, such as polysilicon.

As shown in FIG. 1A, a dielectric layer 102 is formed over the semiconductor substrate 100, in accordance with some embodiments. The dielectric layer 102 surrounds the conductive feature 104 and the element 106. The dielectric layer 102 may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable dielectric materials, or a combination thereof. In some embodiments, one or more dielectric layers and conductive features are formed between the semiconductor substrate 100 and the dielectric layer 102.

Afterwards, a dielectric layer 108 is deposited over the dielectric layer 102, the conductive feature 104, and the element 106, as shown in FIG. 1A in accordance with some embodiments. The material of the dielectric layer 108 may be the same as or similar to those of the dielectric layer 102. The dielectric layer 108 may be deposited using a chemical vapor deposition (CVD) process, an atomic layer deposition (ALD) process, a physical vapor deposition (PVD) process, a spin coating process, a spray coating process, one or more other applicable processes, or a combination thereof.

In some embodiments, the dielectric layer 108 is then planarized to facilitate subsequent processes. The dielectric layer 108 may be planarized using a chemical mechanical polishing (CMP) process, a grinding process, a dry polishing process, an etching process, one or more other applicable processes, or a combination thereof.

Figure 1B:
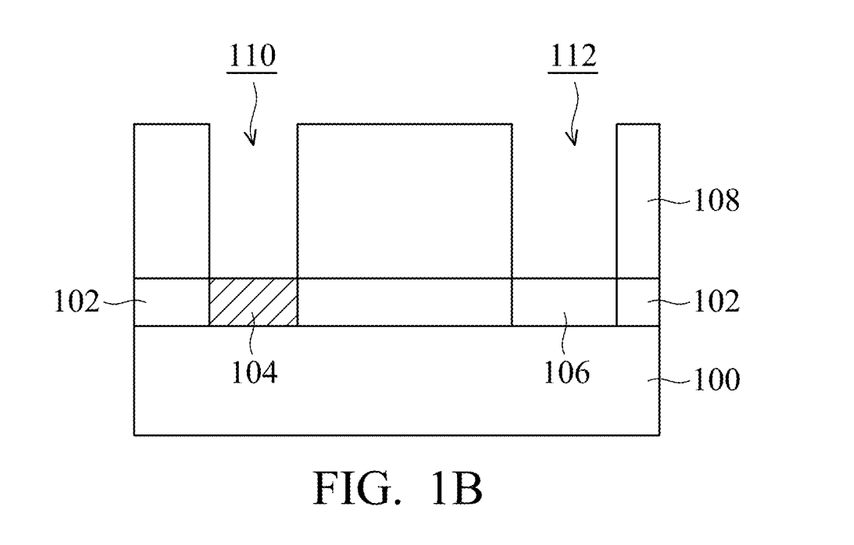

As shown in FIG. 1B, openings 110 and 112 are formed in the dielectric layer 108, in accordance with some embodiments. The opening 110 exposes the conductive feature 104. The opening 112 exposes the element 106. In some embodiments, the opening 110 is substantially as wide as the opening 112. In some other embodiments, the opening 112 is wider than the opening 110. The formation of the openings 110 and 112 may involve one or more photolithography processes and one or more etching processes. In some embodiments, the openings 110 and 112 are formed simultaneously. In some other embodiments, the opening 110 is formed before the opening 112.

Figure 1C:
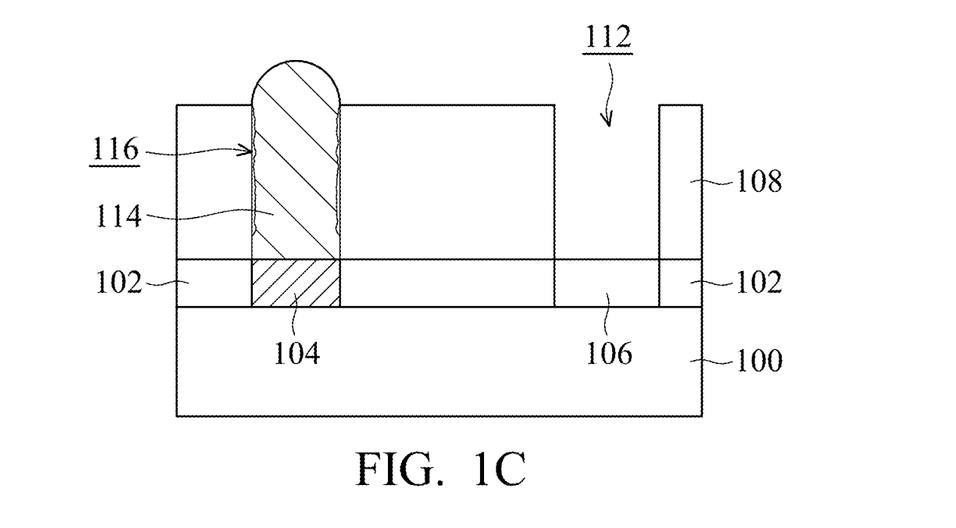

As shown in FIG. 1C, a conductive material 114 is formed to overfill the opening 110, in accordance with some embodiments. A portion of the conductive material 114 protrudes from the top surface of the dielectric layer 108. In some embodiments, the conductive material 114 is formed directly on the conductive feature 104.

In some embodiments, the conductive material 114 is made of a material different from that of the conductive feature 104. The conductive material 114 may be made of or include tungsten, ruthenium, cobalt, gold, platinum, one or more other suitable materials, or a combination thereof. In some embodiments, the conductive material 114 is a tungsten-containing material. In some other embodiments, the conductive material 114 is tungsten. In some other embodiments, the conductive material 114 is an alloy containing tungsten.

The conductive material 114 may be formed using a selective growth process, a CVD process, an ALD process, an electroless plating process, one or more other applicable processes, or a combination thereof. In some embodiments, the conductive material 114 is selectively grown or formed on the conductive feature 104 that is made of a specific metal material such as cobalt or ruthenium.

In some embodiments, the conductive material 114 is selectively grown or formed on the conductive feature 104 without being formed in the opening 112. For example, the element 106 may be made of a semiconductor material. The precursor used for growing or forming the conductive material 114 does not react with the element 106 and the dielectric layer 108. Therefore, no conductive material is formed on the element 106 to fill the opening 112. In some embodiments, the precursors used in the selective growth process include a metal-containing compound and a semiconductor-containing compound. For example, in a particular embodiment the precursors used in the selective growth process include $WF_6$ and $SiH_4$. In some embodiments, the selective growth process is performed using CVD equipment.

Alternatively, in some other embodiments, a mask element is used to cover the opening 112 during the formation of the conductive material 114. Therefore, the conductive material 114 is prevented from being formed in the opening 112.

Alternatively, in some other embodiments, the opening 112 is formed after the conductive material 114 is formed to fill the opening 110. In these cases, the conductive material 114 is also not formed in the opening 112.

In some embodiments, these is no barrier layer (such as a titanium/titanium nitride layer) formed over sidewalls and a bottom of the opening 110 before the conductive material 114 is formed. In some embodiments, the conductive material 114 is in direct contact with the dielectric layer 108. In some embodiments, the adhesion between the conductive material 114 and the dielectric layer 108 is not as strong as the adhesion between the conductive material 114 and the conductive feature 104. No barrier layer is formed between the conductive material 114 and the dielectric layer 108 to enhance the adhesion therebetween. As a result, one or more holes 116 (or cracks) may be formed between the conductive material 114 and the dielectric layer 108. One of the holes 116 may be surrounded by the dielectric layer 108 and the conductive material 114. In some cases, the holes 116 are very small. A high resolution transmission electron microscope (HRTEM) or other suitable equipment might be used to observe the holes 116.

In some embodiments, the conductive material 114 and the conductive feature 104 are in direct contact with each other without being separated from each other by a barrier layer. Therefore, electrical resistance between the conductive material 114 and the conductive feature 104 is significantly reduced since the barrier layer may have a high resistance.

Figure 1D:
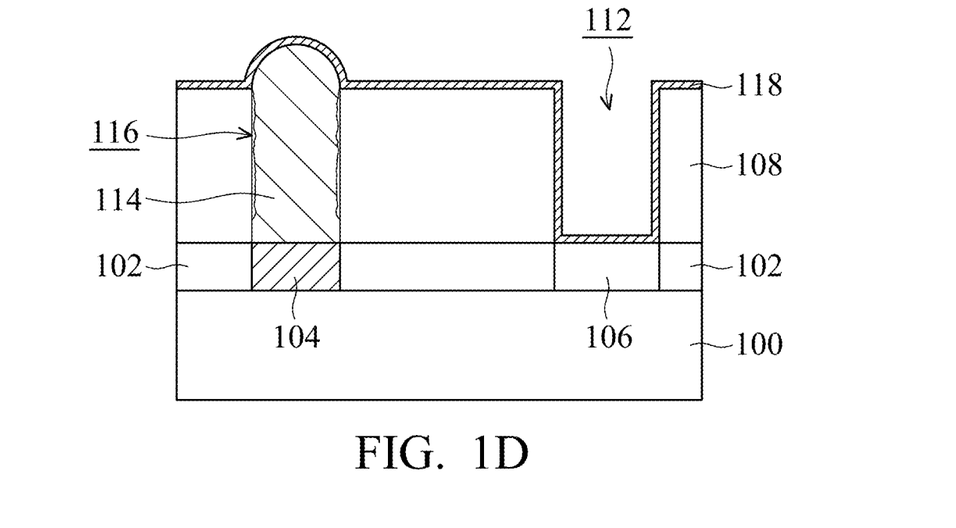

As shown in FIG. 1D, a barrier layer 118 is deposited over the conductive material 114, the dielectric layer 108, and the element 106, in accordance with some embodiments. The barrier layer 118 extends on the sidewalls and bottom of the opening 112. The barrier layer 118 may function as an adhesion layer between the dielectric layer 108 and a conductive material to be formed in the opening 112 later.

In some embodiments, the barrier layer 118 is a single layer. In some other embodiments, the barrier layer 118 has a multilayer structure that includes multiple sub-layers. The sub-layers may be made of different materials. The barrier layer 118 may be made of or include titanium nitride, titanium, tantalum nitride, tantalum, one or more other suitable materials, or a combination thereof. The barrier layer 118 may be deposited using a CVD process, a PVD process, an ALD process, one or more other applicable processes, or a combination thereof.

Figure 1E:
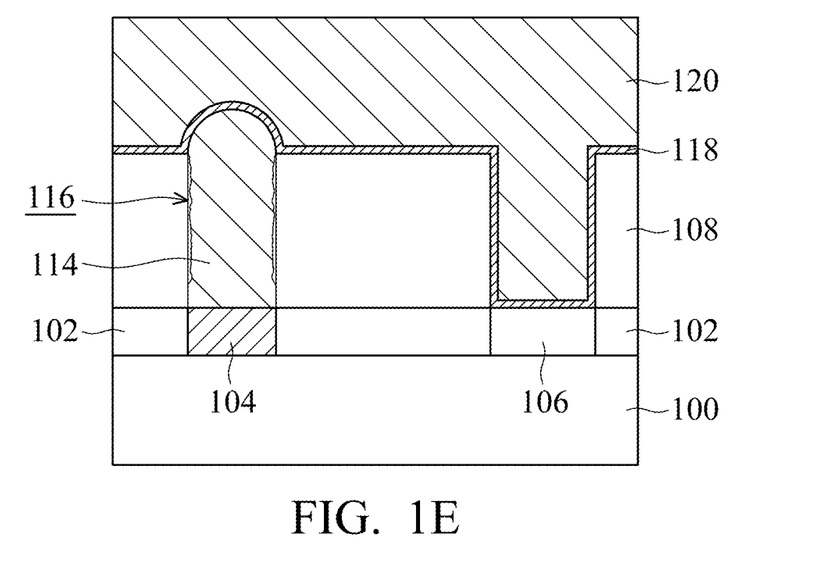

As shown in FIG. 1E, a conductive material 120 is deposited over the barrier layer 118, in accordance with some embodiments. The conductive material 120 overfills the opening 112. In some embodiments, the conductive material 120 and the conductive material 114 are made of the same material. In some embodiments, the conductive material 120 is a tungsten-containing material. In some other embodiments, the conductive material 120 is tungsten. In some other embodiments, the conductive material 120 is an alloy containing tungsten. The conductive material 120 may be formed using a CVD process.

Figure 1F:
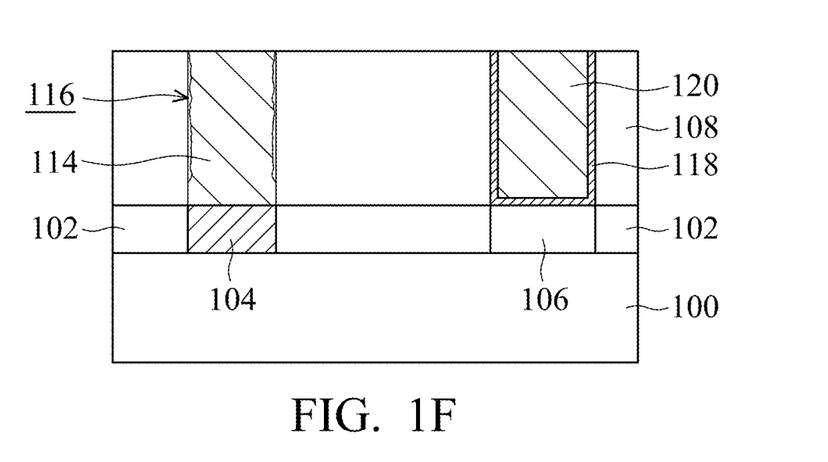

As shown in FIG. 1F, the conductive material 120, the barrier layer 118, and the conductive material 114 are planarized to expose the dielectric layer 108, in accordance with some embodiments. In some embodiments, a first CMP process is used to planarize the conductive material 120, the barrier layer 118, and the conductive material 114. The dielectric layer 108 may function as a CMP stop layer. In some embodiments, the first CMP process mentioned above is performed using a first CMP pad. In some embodiments, the first CMP pad is a hard pad.

Afterwards, the structure shown in FIG. 1F is transferred onto a second CMP pad to perform a second CMP process (or buffing CMP process). In some embodiments, the second CMP pad is a soft pad that is softer than the first CMP pad. The first CMP pad may be used to planarize the conductive material 120 until the dielectric layer 108 is exposed. The second CMP pad may be used to partially remove the conductive materials 114 and 120 and the dielectric layer 108 to form conductive features with the desired height.

In some embodiments, a first slurry provided onto the first CMP pad during the first CMP process is different from a second slurry provided onto the second CMP pad during the second CMP process (or buffing CMP process). In some embodiments, the second slurry includes an oxidizer (or oxidant) that is capable of oxidizing the conductive material 114. The oxidizer may be used to transform a portion of the conductive material 114 into an oxide material.

Figure 1G:
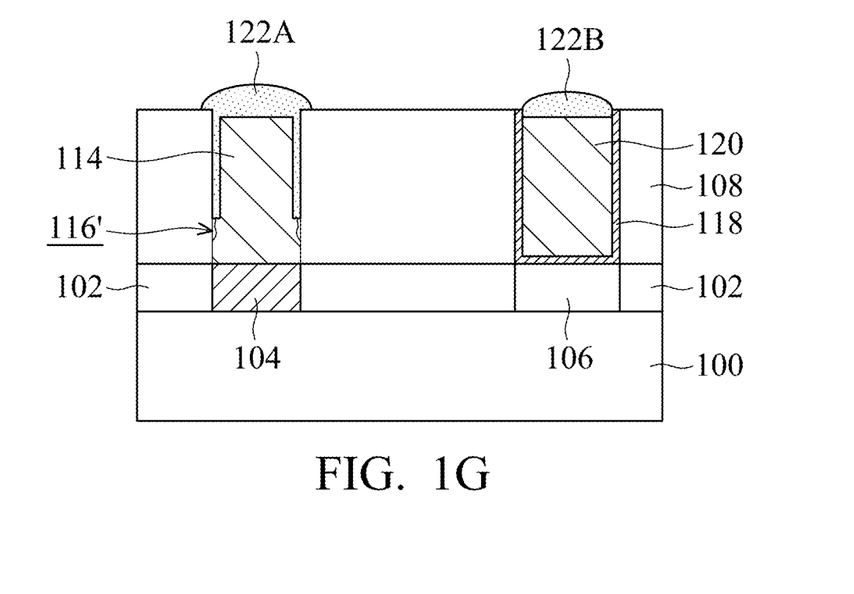

FIG. 1G shows a cross-sectional view of the semiconductor device structure after an initial stage of the second CMP process, in accordance with some embodiments. During an initial stage of the second CMP process, the oxidizer in the second slurry may oxidize a portion of the conductive material 114 and/or a portion of the conductive material 120. As a result, a portion of the conductive material 114 is oxidized and transformed into an oxide material 122A. A portion of the conductive material 120 is oxidized and transformed into an oxide material 122B. In some embodiments, the conductive materials 114 and 120 are made of the same metal material. In these cases, the oxide materials 122A and 122B are made of the same metal oxide material.

In some embodiments, the conductive material 114 is made of a metal material. The oxide material 122A is made of an oxide material of the metal material. In some embodiments, the oxide material 122A is made of a material that is different from that of the dielectric layer 108. In some embodiments, the conductive material 120 is a tungsten-containing material. In these cases, the oxide material 122A may be made of a tungsten-containing oxide material. In some embodiments, the oxide material 122A includes tungsten oxide. In some embodiments, the oxide material 122A includes $WO_3$. In some embodiments, the oxide material 122A includes or is made of a mixture of $WO_3$ and $WO_2$.

In some embodiments, a portion of the second slurry is drawn to reach sidewalls of the hole 116 due to the capillary phenomenon. As a result, a portion of the conductive material 114 that surrounds the hole 116 is oxidized and transformed into the oxide material 122A, as shown in FIG. 1G in accordance with some embodiments.

In some embodiments, the portion of the conductive material 114 that is oxidized expands and becomes the oxide material 122A. As a result, the hole 116 is partially filled with the oxide material 122A. In some embodiments, a hole 116' (that is smaller) is formed between the oxide material 122A and the conductive feature 104, as shown in FIG. 1G. Alternatively, the hole 116 may be completely filled with the oxide material 122A. The oxide material 122A may prevent the second slurry from being further drawn to reach the conductive feature 104. Since the second slurry is separated from the conductive feature 104 by the oxide material 122A, the conductive feature 104 is prevented from being negatively affected by the second slurry.

In some embodiments, the oxidizer in the second slurry includes an iron-containing oxidizer. In some embodiments, the iron-containing oxidizer includes ferric nitrate. In some embodiments, a weight percentage of the iron-containing oxidizer in the second slurry is in a range from about 0.1% to about 2%. In some other embodiments, the iron-containing oxidizer includes $Fe(NO_3)_2$, $KFe(CN)_6$, $Fe(NO_3)_3$, one or more other suitable oxidizers, or a combination thereof.

In some embodiments, the second slurry includes an acid and may damage the conductive feature 104 if the second slurry reaches the conductive feature 104. For example, the conductive feature 104 may be made of cobalt or another material having lower resistance to the acid slurry. In some embodiments, the second slurry has a pH value that is in a range from about 2 to about 4.

In some cases, the weight percentage of the iron-containing oxidizer in the second slurry is smaller than about 0.1%. The amount of the conductive material 114 that is oxidized by the iron-containing oxidizer may be insufficient such that the oxide material 122A may have a small volume. As a result, the second slurry might still have chance to reach the conductive feature 104 during the second CMP process. The second slurry may therefore damage the conductive feature 104, which leads to low yield. In some other cases, the weight percentage of the iron-containing oxidizer in the second slurry is greater than about 2%. In these cases, the quality of the conductive material 114 might be negatively affected.

Additionally, utilizing iron-containing oxidizers provides for additional advantages over other oxidizers. For example, if oxidizers such as $H_2O_2$ are utilized, the oxidizer may not be able to block the hole 116, and the second slurry may reach the conductive feature 104 through the hole 116 and damage the conductive feature 104. For example, in embodiments in which the conductive feature 114' is made of tungsten, the oxide material formed using an oxidizer such as $H_2O_2$ may be $WO_2$ that may has a relatively small volume and may not be able to block the hole 116 and prevent the second slurry from reaching and damaging the conductive feature 104.

In some embodiments, the second slurry further includes an inhibitor that is used to protect the formed oxide material 122A or 122B. In some embodiments, the inhibitor includes one or more carbon chains. In some embodiments, the carbon number of the carbon chain (or one of the carbon chains) is in a range from 10 to 1000. In some embodiments, a weight percentage of the inhibitor in the second slurry is in a range from about 0.01% to about 1%. In particular embodiments, the inhibitor may include histidine, glycine, polyethylenimine, benzhydryl compounds, benzotriazole, one or more other suitable compounds, or a combination thereof.

In some embodiments, the second slurry further includes abrasive. The abrasive may be made of silicon oxide. In some embodiments, a weight percentage of the abrasive in the second slurry is in a range from about 1% to about 4%.

Figure 1H:
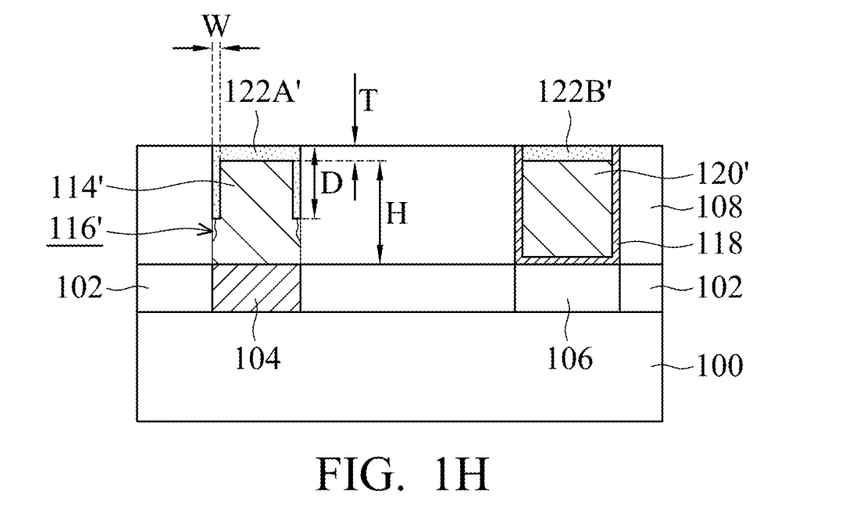

As shown in FIG. 1H, the second CMP process continues to partially remove and thin the conductive materials 114 and 120 and the dielectric layer 108, in accordance with some embodiments. The upper portions of the conductive materials 114 and 120, the oxide materials 122A and 122B, and the dielectric layer 108 are removed during the second CMP process. The remaining portions of the oxide materials 122A and 122B form protective elements 122A' and 122B', respectively. In some embodiments, the top surfaces of the protective elements 122A' and 122B' are substantially coplanar with the top surface of the dielectric layer 108. The remaining portions of the conductive materials 114 and 120 form conductive features 114' and 120', respectively.

As shown in FIG. 1H, the protective element 122A' is positioned between a portion of the dielectric layer 108 and a portion of the conductive feature 114'. In some embodiments, the hole 116' is surrounded by the protective element 122A', the conductive feature 114, and the dielectric layer 108, as shown in FIG. 1H. Due to the protective element 122A', the second slurry is prevented from reaching and damaging the conductive feature 104.

During the second CMP process, the second slurry is kept at a suitable operation temperature. In some embodiments, the second slurry is kept at a temperature that is in a range from about 20 degrees C. to about 50 degrees C. during the second CMP process.

During the second CMP process, the second slurry is provided onto the second CMP pad at a suitable flow rate. The flow rate may be in a range from about 100 mL/min to about 500 mL/min.

During the second CMP process, the second CMP pad is rotated at a suitable rotation speed. The rotation speed may be in a range from about 40 RPM to about 120 RPM.

During the second CMP process, a suitable pressure is applied on the substrate holder against the second CMP pad. The applied pressure may be in a range from about 50 hPa to about 500 hPa.

As shown in FIG. 1H, the protective element 122A' has an upper portion that is positioned above the top surface of the conductive feature 114'. The upper portion has a thickness T. The thickness T may be in a range from about 20 Å to about 50 Å. The protective element 122A' has a side portion that is positioned between the sidewall of the conductive feature 114' and the dielectric layer 108. The side portion has a width W. The width W may be in a range from about 5 Å to about 10 Å. The protective element 122A' has a depth D. The depth D may be in a range from about 20 Å to about 50 Å. The conductive feature 114' has a height H. The height H may be in a range from about 100 Å to about 300 Å.

Figure 1I:
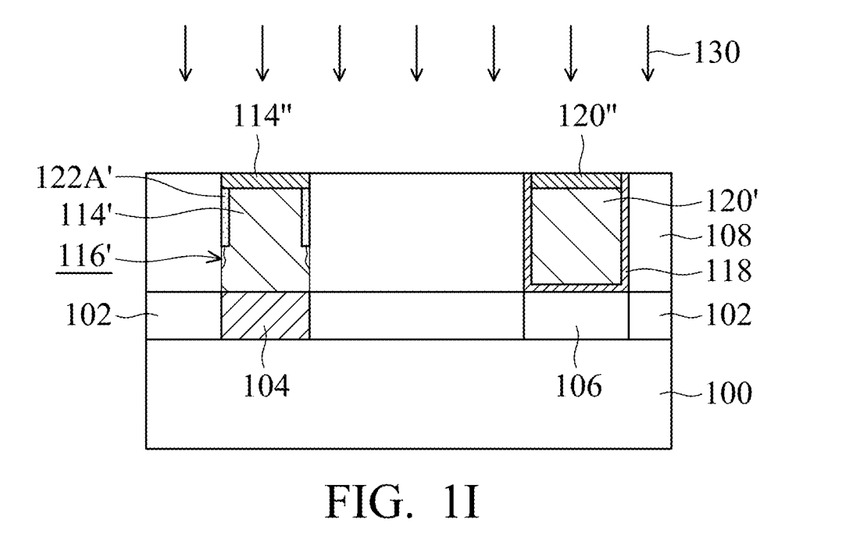

As shown in FIG. 1I, a reduction process 130 is used to reduce portions of the protective elements 122A' and 122B' to respectively form metal elements 114" and 120", in accordance with some embodiments. In some embodiments, the protective element 122B' is completely reduced to form the metal element 120". In some embodiments, the reduction process 130 includes applying a reduction media on the protective elements 122A' and 122B'. In some embodiments, the reduction media is a hydrogen-containing media, such as hydrogen gas or hydrogen-containing plasma. In some other embodiments, a solution or liquid that contains a suitable reducing agent is applied on the protective elements 122A' and/or 122B' to form the metal elements 114" and 120".

In some embodiments, the metal elements 114" and 120" are electrically connected to the conductive features 114' and 120', respectively. After the reduction process 130, other conductive features may be formed on the metal elements 114" and 120" to form electrical connections to the conductive features 114' and 120', respectively.

In some embodiments, because no barrier layer is formed between the conductive features 114' and 104, electrical connection between the conductive features 114' and 104 is significantly improved. In some embodiments, due to the iron-containing oxidizer used in the CMP process for forming the conductive feature 114', the protective element 122A' is formed to prevent the slurry from reaching and damaging the conductive feature 104. The quality and reliability of the conductive feature 104 are therefore ensured.

Many variations and/or modifications can be made to embodiments of the disclosure. In some other embodiments, the protective element 122A' has a profile different from that shown in FIGS. 1H and 1I. Due to different materials used and/or different process conditions applied, the profile of the protective element 122A may be varied. The profiles of the protective element 122A' and the conductive feature 114' may be observed using a high resolution transmission electron microscope (HRTEM) or determined using a secondary ion mass spectrometry (SIMS).

Embodiments of the disclosure involve forming an upper conductive feature in a dielectric layer by a CMP process. No barrier layer is formed between the upper conductive feature and the dielectric layer. The slurry used in the CMP process includes an iron-containing oxidizer. The iron-containing oxidizer is capable of oxidizing a portion of the upper conductive feature into a protective element made of an oxide material. The protective element may prevent the slurry from reaching and damaging a lower conductive feature below the upper conductive feature. The quality and reliability of the lower conductive feature are therefore ensured. As mentioned above, no barrier layer is formed. There is no barrier layer formed between the lower conductive feature and the upper conductive feature. Electrical connection between the lower conductive feature and the upper conductive feature is significantly improved.

In accordance with some embodiments, a method for forming a semiconductor device structure is provided. The method includes forming a conductive feature over a semiconductor substrate and forming a dielectric layer over the conductive feature. The method also includes forming an opening in the dielectric layer to expose the conductive feature. The method further includes forming a conductive material to overfill the opening. In addition, the method includes thinning the conductive material using a chemical mechanical polishing process. A slurry used in the chemical mechanical polishing process includes an iron-containing oxidizer that oxidizes a portion of the conductive material.

In accordance with some embodiments, a method for forming a semiconductor device structure is provided. The method includes forming a conductive feature over a semiconductor substrate and forming a dielectric layer over the conductive feature. The method also includes forming an opening in the dielectric layer to expose the conductive feature. The method further includes forming a tungsten-containing material directly on the conductive feature to overfill the opening. In addition, the method includes partially removing the tungsten-containing material and the dielectric layer using a chemical mechanical polishing process. An iron-containing oxidizer transforms a portion of the tungsten-containing material into an oxide material during the chemical mechanical polishing process.

In accordance with some embodiments, a semiconductor device structure is provided. The semiconductor device structure includes a first conductive feature over a semiconductor substrate and a dielectric layer over the first conductive feature. The semiconductor device structure also includes a second conductive feature surrounded by the dielectric layer and electrically connected to the first conductive feature. The second conductive feature is made of a metal material. The semiconductor device structure further includes a protective element between a portion of the second conductive feature and a portion of the dielectric layer. The protective element is an oxide material of the metal material. The protective element has a height that is less than a height of the second conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a conductive feature over a semiconductor substrate;
    forming a dielectric layer over the conductive feature;
    forming an opening in the dielectric layer to expose the conductive feature;
    forming a conductive material to overfill the opening; and
    thinning the conductive material using a chemical mechanical polishing process, wherein a slurry used in the chemical mechanical polishing process comprises an iron-containing oxidizer that oxidizes a portion of the conductive material to form an oxidized portion located between the dielectric layer and a non-oxidized portion of the conductive material, wherein the oxidized portion has a height less than a height of the conductive material.

2. The method for forming a semiconductor device structure as claimed in claim 1, wherein a weight percentage of the iron-containing oxidizer in the slurry is in a range from about 0.1% to about 2%.

3. The method for forming a semiconductor device structure as claimed in claim 1, wherein the iron-containing oxidizer comprises ferric nitrate.

4. The method for forming a semiconductor device structure as claimed in claim 1, wherein the slurry has a pH value in a range from about 2 to about 4.

5. The method for forming a semiconductor device structure as claimed in claim 1, wherein the slurry comprises an inhibitor, and the inhibitor comprises a carbon chain having a carbon number in a range from 10 to 1000.

6. The method for forming a semiconductor device structure as claimed in claim 5, wherein a weight percentage of the inhibitor in the slurry is in a range from about 0.01% to about 1%.

7. The method for forming a semiconductor device structure as claimed in claim 1, wherein the slurry is kept at a temperature in a range from about 20 degrees C. to about 50 degrees C. during the chemical mechanical polishing process.

8. The method for forming a semiconductor device structure as claimed in claim 1, wherein there is no barrier layer formed over sidewalls of the opening before the conductive material is formed.

9. The method for forming a semiconductor device structure as claimed in claim 1, further comprising:
    forming a second opening in the dielectric layer before the conductive material is formed;
    forming a barrier layer over the conductive material, wherein the barrier layer extends over a bottom and sidewalls of the second opening;
    forming a second conductive material over the barrier layer, wherein the second conductive material overfills the second opening; and
    planarizing the second conductive material, the barrier layer, and the conductive material to expose the dielectric layer.

10. The method for forming a semiconductor device structure as claimed in claim 9, wherein the conductive material is selectively formed on the conductive feature without being formed in the second opening.

11. A method for forming a semiconductor device structure, comprising:
    forming a conductive feature over a semiconductor substrate;
    forming a dielectric layer over the conductive feature;
    forming an opening in the dielectric layer to expose the conductive feature;
    forming a tungsten-containing material directly on the conductive feature to overfill the opening;
    partially removing the tungsten-containing material and the dielectric layer using a chemical mechanical polishing process, wherein an iron-containing oxidizer transforms a portion of the tungsten-containing material into an oxide material during the chemical mechanical polishing process;
    forming a second opening in the dielectric layer before the tungsten-containing material is formed;
    forming a barrier layer over the tungsten-containing material, wherein the barrier layer extends over a bottom and sidewalls of the second opening;
    forming a second tungsten-containing material over the barrier layer, wherein the second tungsten-containing material overfills the second opening; and
    planarizing the second tungsten-containing material, the barrier layer, and the tungsten-containing material to expose the dielectric layer.

12. The method for forming a semiconductor device structure as claimed in claim 11, wherein the iron-containing oxidizer comprises ferric nitrate, and a weight percentage of the iron-containing oxidizer in the slurry is in a range from about 0.1% to about 2%.

13. The method for forming a semiconductor device structure as claimed in claim 11, wherein the slurry comprises an inhibitor, the inhibitor comprises a carbon chain having a carbon number in a range from 10 to 1000, and a weight percentage of the inhibitor in the slurry is in a range from about 0.01% to about 1%.

14. The method for forming a semiconductor device structure as claimed in claim 11, wherein the tungsten-containing material is selectively formed on the conductive feature without being formed in the second opening.

15. The method as claimed in claim 11, wherein the oxide material is located between the dielectric layer and a non-oxidized portion of the tungsten-containing material, and wherein the oxide material has a height less than a height of the tungsten-containing material.

16. A method of manufacturing a semiconductor device, the method comprising:
    forming a first conductive feature over a semiconductor substrate;
    forming a dielectric layer over the first conductive feature;
    forming a second conductive feature surrounded by the dielectric layer and electrically connected to the first conductive feature, wherein the second conductive feature is made of a metal material; and
    forming a protective element between a portion of the second conductive feature and a portion of the dielectric layer, wherein the protective element is an oxide material of the metal material, wherein the protective element has a height that is less than a height of the second conductive feature.

17. The method as claimed in claim 16, wherein the metal material comprises tungsten, and the oxide material of the metal material comprises tungsten oxide.

18. The method as claimed in claim 16, wherein the forming the protective element comprises forming a mixture of $WO_3$ and $WO_2$.

19. The method as claimed in claim 16, wherein a hole is surrounded by the protective element, the second conductive feature, and the dielectric layer.

20. The method as claimed in claim 16, wherein the first conductive feature and the second conductive feature are made of different materials.

* * * * *